United States Patent [19]

Schnable et al.

[11] 4,196,232

[45] Apr. 1, 1980

[54] METHOD OF CHEMICALLY VAPOR-DEPOSITING A LOW-STRESS GLASS LAYER

[75] Inventors: George L. Schnable, Lansdale, Pa.; Albert W. Fisher, Ringoes, N.J.

[73] Assignee: RCA Corporation, New York, N.Y.

[21] Appl. No.: 642,141

[22] Filed: Dec. 18, 1975

[51] Int. Cl.² ............... C23D 5/10; C23C 13/04; C01B 33/12
[52] U.S. Cl. .................... 527/255.3; 427/95
[58] Field of Search .................. 427/248 C, 95

[56] References Cited

U.S. PATENT DOCUMENTS

| | | | |
|---|---|---|---|
| 3,243,323 | 3/1966 | Corrigon et al. | 148/175 |
| 3,258,359 | 6/1966 | Hugle | 148/175 X |
| 3,331,716 | 7/1967 | Bloem et al. | 148/174 |
| 3,481,781 | 12/1969 | Kern | 427/95 |
| 3,511,703 | 5/1970 | Peterson | 427/248 C |
| 3,850,687 | 11/1974 | Kern | 427/248 |

FOREIGN PATENT DOCUMENTS 47-12408  4/1972  Japan ............................ 427/95

OTHER PUBLICATIONS

Deal, "The Oxidation of Silicon . . . ", (1963) *J. Electrochem. Soc.*, vol. 110, No. 6, pp. 527–532.
Ackerman et al, *IBM Tech Discl. Bull.*, vol. 15, No. 12, May 1973 p. 3888.
Bratter et al, *IBM Tech Discl. Bull.*, vol. 15, No. 2, Jul. 1972 p. 685.
Ghezzo, *J. Electrochem. Soc.*, pp. 1428–1430, vol. 119, No. 10, Oct. 1972.

*Primary Examiner*—James R. Hoffman
*Attorney, Agent, or Firm*—H. Christoffersen; R. P. Williams; T. H. Magee

[57] ABSTRACT

A method of chemically vapor-depositing a low-stress glass layer onto a substrate which is heated in an atmosphere including silane, oxygen, and an inert carrier gas, comprises the step of adding water vapor to the atmosphere to increase the water vapor content of the atmosphere substantially above that normally present therein from the oxidation of the silane.

16 Claims, No Drawings

METHOD OF CHEMICALLY VAPOR-DEPOSITING A LOW-STRESS GLASS LAYER

The Government has rights in this invention pursuant to Contract No. F3365-74-C-5146 awarded by the Department of the Air Force.

This invention relates to an improved method of chemically vapor-depositing a glass layer onto a substrate comprising heating the substrate in an atmosphere including silane, oxygen, and an inert carrier gas, to a temperature such that the silane is oxidized to form silicon dioxide which is deposited as a layer onto the substrate.

Glass layers are widely used in the fabrication of semiconductor integrated circuit devices for many different purposes such as, for example, masking operations, diffusion sources, insulators, scratch protection of underlying material, device passivation, and gettering. Such glass layers include both silicon dioxide ($SiO_2$) layers and doped silicon dioxide layers, such as, for example, borosilicate glass layers (layers containing boron trioxide, $B_2O_3$) and phosphosilicate glass layers (layers containing phosphorous pentoxide, $P_2O_5$). A typical method for chemically vapor-depositing a silicon dioxide layer onto a substrate comprises heating the substrate in an atmosphere including silane ($SiH_4$), oxygen, an inert carrier gas, and a hydride or alkyl of a dopant if a doped silicon dioxide layer is desired, to a temperature such that the silane is oxidized to form silicone dioxide which is deposited as a layer onto the substrate. A complete description of such a process for chemically vapor-depositing a silicate glass layer is described in U.S. Pat. No. 3,481,781, issued to Werner Kern on Dec. 2, 1969, and assigned to the same assignee as is the present application.

Such glass layers, as deposited, are generally in tensile stress. In semiconductor devices where the glass layers are deposited over metal, cracks and pin holes frequently form in such glass layers when these devices are heated. For example, silicon dioxide layers are typically used in integrated circuit devices as insulating layers between multilevel aluminum interconnections. Upon heating such silicon dioxide layers beyond their deposition temperature such as, for example, beyond 450° C., the tensile stress in such layers becomes larger due to the aluminum expanding more than the silicon dioxide, and numerous cracks are generated in such layers. These cracks may cause the multilevel aluminum interconnections to short, which results in the failure of such devices. In devices where silicon dioxide layers are deposited over aluminum for passivation and scratch protection, such cracks would allow moisture to penetrate to the aluminum interconnects, whereby aluminum corrosion would occur. Such corrosion would continue until the aluminum interconnects are completely corroded, which results in open circuits and the failure of such devices.

It has previously been found that tensile stress in chemically vapor-deposited glass layers can be relieved by densification of the glass layers at temperatures above the deposition temperature. For example, it is possible to densify silicate glass layers sufficiently by heating them in ambients such as pure nitrogen at about 800° C. for about fifteen minutes. However, it is sometimes necessary to deposit metallic contacts such as, for example, aluminum before the glass layer is applied. Such devices cannot be safely heated much beyond 450° C. for prolonged periods of time since the aluminum will alloy with the silicon at the Al-Si eutectic temperature of about 575° C. Another method for densifying a deposited layer of silicate glass which avoids such high temperatures comprises heating the glass layer at a temperature of the order of about 400° to 450° C. in an atmosphere of water vapor, which acts as a catalyst during such low-temperature densification treatment. A complete description of such a process can be found in U.S. Pat. No. 3,850,687, issued to Werner Kern on Nov. 26, 1974, and assigned to the same assignee as is the present invention.

The aforementioned densification methods cause the stress in such glass layers at room temperature to go from tensile stress to compressive stress. However, it is desirable to be able to chemically vapor-deposit glass layers which, upon deposition, are in compressive stress or in relatively low tensile stress at room temperature or at rated device operating temperatures. Such low-stress glass layers would be much less susceptible to the formation of cracks, and thus any further densification treatment would not be necessary.

In accordance with the novel method of the present invention, a low-stress glass layer is deposited onto a heated substrate from the oxidation of gaseous silane by intentionally adding water vapor to the atmosphere in a chemical vapor deposition (CVD) reaction chamber, in order to increase the water vapor content of the atmosphere substantially above that normally present therein resulting from the oxidation of the silane. This is accomplished preferably by passing an inert carrier gas such as, in the present example, nitrogen ($N_2$) through a bubbler containing water, in order to saturate the nitrogen with water vapor at room temperature. The nitrogen saturated with water vapor then passes from the bubbler through a conduit and ultimately into the CVD reaction chamber. The water vapor content may be increased by also passing oxygen through a bubbler in a similar manner.

The low-stress glass layer is deposited onto the heated substrate by the oxidation of the gaseous silane in the presence of oxygen according to the following reaction:

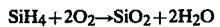

$$SiH_4 + 2O_2 \rightarrow SiO_2 + 2H_2O$$

Since water vapor is one of the reaction products, it is necessary to substantially increase the water vapor content of the atmosphere in order to observe an effect. Assuming that approximately fifty percent of the gaseous silane in the CVD reaction chamber is oxidized, the water vapor content in mole percent of the atmosphere in the chamber is, under steady-state conditions, increased by factors of about four (4), seven (7), nine (9), or fifteen (15) times the water vapor content normally present therein from the assumed fifty percent oxidation of the silane, as described respectively in the different examples outlined below. A detailed description of the different steps performed in carrying out the chemical vapor deposition process using gaseous silane, oxygen, and an inert carrier gas, is contained in the aforementioned Kern patent, U.S. Pat. No. 3,481,781, the disclosure of which is incorporated herein by reference.

EXAMPLE 1

Utilizing an apparatus such as disclosed in the Kern patent, a heating circuit is first actuated to bring the CVD system up to the desired deposition temperature which, in the present example, is 450° C. A regulating assembly which delivers the various gases into the CVD reaction chamber is then turned on so as to deliver oxygen and nitrogen saturated with water vapor to the interior of the chamber. Next, the substrate which comprises, in the present example, a 0.0055 inch (0.14 mm) thick silicon wafer having a (111) plane orientation, is placed on a holder within the CVD chamber and allowed to heat up to the 450° C. deposition temperature.

Next, the silane flow into the CVD chamber is started. In the present example, the silane source comprises ten percent silicon tetrahydride ($SiH_4$) by volume in argon. A layer of silicon dioxide, having a thickness of approximately 10,000 Å in the present example, is subsequently deposited onto the substrate as the silane is oxidized by the oxygen.

The flow rates of the various constituents at the deposition temperature will control the rate at which the silicon dioxide layer is deposited. In the present example, flow rates of 6000 cubic centimeters per minute of nitrogen saturated with water vapor at 25° C., 687 cubic centimeters per minute of oxygen, and 233 cubic centimeters per minute of ten percent $SiH_4$ in argon are used. Under these flow conditions, the water vapor content in mole percent of the atmosphere is increased by a factor of about 9.2 times, and a deposition rate of about 1000 Å per minute is obtained.

In order to provide comparative data to show that tensile stress is lowered by depositing silicon dioxide layers in a CVD reaction chamber wherein the water vapor content of the atmosphere therein is increased substantially above that normally present from the oxidation of the silane, the chemical vapor-deposition method of Example 1 is repeated except that no additional water vapor is added to the atmosphere. Using the same flow rates, no appreciable change in the deposition rate from that of Example 1 is observed.

EXAMPLE 2

The chemical vapor-deposition method of Example 1 is followed except that the flow rate of the ten percent silane in argon is reduced to 94 cubic centimeters per minute, whereby the water vapor content in mole percent of the atmosphere is increased by a factor of about 14.5 times that normally present from the oxidation of the silane. By changing the flow rate of the ten percent silane in argon, the deposition rate in this example is reduced to about 350 Å per minute.

In order to provide comparative data, the chemical vapor deposition method of Example 2 is repeated except that no additional water vapor is added to the atmosphere. Using the same flow rates, no appreciable change in the deposition rate from that of Example 2 is observed.

EXAMPLE 3

The CVD method of Example 1 is followed except that the deposition temperature is reduced to 350° C. and the flow rate of the ten percent silane in argon is increased to 425 cubic centimeters per minute, whereby the water vapor content in mole percent of the atmosphere is increased by a factor of about 4.15 times that normally present from the oxidation of the silane and the deposition rate is increased to about 1750 Å per minute.

In order to provide comparative data, the CVD method of Example 3 is repeated except that no additional water vapor is added to the atmosphere.

EXAMPLE 4

The CVD method of Example 3 is followed except that the flow rate of the ten percent silane in argon is reduced to 233 cubic centimeters per minute, whereby the water vapor content in mole percent of the atmosphere is increased by a factor of about 6.7 times that normally present from the oxidation of the silane, and the deposition rate is reduced to about 500 Å per minute.

In order to provide comparative data, the CVD method of Example 4 is repeated except that no additional water vapor is added to the atmosphere.

In order to determine the effect which the increased water vapor content of the atmosphere has on reducing the tensile stress of the silicon dioxide layers deposited in the aforementioned examples, stress measurements at room temperature were made and the results, expressed in dynes/$cm^2$, are shown in Table I. In each Example, the substrate deflection (as calculated by measuring the displacement of the center of the circular silicon wafer in relation to its edges) caused by the tensile stress of the silicon dioxide film was measured and, after correcting for initial substrate flatness, the average stress in dynes/$cm^2$ was calculated from a known equation which expresses stress as a function of the substrate deflection.

TABLE I

| GLASS LAYERS ON SILICON | | | |
|---|---|---|---|
| | Water Vapor Content Factor Increase Over That Present From Chemical Reaction | Deposition Rate (Å Per Minute) | Stress × $10^9$ Dynes/$cm^2$) |
| Silicon Dioxide | No Increase | 1000 | 2.8 |
| Layer Deposited | 9.2 Times | 1000 | 2.4 |
| Upon a Silicon | No Increase | 350 | 2.7 |
| Wafer at 450° C. | 14.5 Times | 350 | 1.7 |
| Silicon Dioxide | No Increase | 1750 | 3.2 |
| Layer Deposited | 4.15 Times | 1750 | 2.8 |
| Upon a Silicon | No Increase | 500 | 2.5 |
| Wafer at 350° C. | 6.7 Times | 500 | 2.2 |

Table I shows that the tensile stress in the deposited layers of silicon dioxide is reduced by increasing the water vapor content of the atmosphere in the CVD reaction chamber. Although the stress in such layers is reduced by also decreasing the deposition rate, Table I shows that at an average deposition rate of about 1000 Å per minute, the tensile stress in silicon dioxide layers deposited at about 450° C. and having a thickness of about 10,000 Å is reduced from 2.8×$10^9$ dynes/$cm^2$ to 2.4×$10^9$ dynes/$cm^2$ by increasing the water vapor content in mole percent of the atmosphere by a factor of about 9.2 times that normally present from the oxidation of the silane. At the same deposition temperature of about 450° C., but at a deposition rate of about 350 Å per minute, the tensile stress is reduced from 2.7×$10^9$ dynes/$cm^2$ to 1.7×$10^9$ dynes/$cm^2$ by increasing the water vapor content by a factor of about 14.5 times.

While a deposition temperature of 450° C. is acceptable where an aluminum metallization system is used, in applications where a gold metallization system is used, a deposition temperature of about 350° C. is generally utilized since the gold will alloy with the silicon at the Au-Si eutectic temperature of about 370° C. Using a deposition temperature of about 350° C., Table I shows that, at an average deposition rate of about 1750 Å per minute, the tensile stress in the deposited silicon dioxide layers is reduced from $3.2 \times 10^9$ dynes/cm$^2$ to $2.8 \times 10^9$ dynes/cm$^2$ by increasing the water vapor content in mole percent of the atmosphere by a factor of about 4.15 times that normally present from the oxidation of the silane. At the same deposition temperature of about 350° C., but at an average deposition rate of about 500 Å per minute, the tensile stress is reduced from $2.5 \times 10^9$ dynes/cm$^2$ to $2.2 \times 10^9$ dynes/cm$^2$ by increasing the water vapor content by a factor of about 6.7 times that normally present from the assumed fifty percent oxidation of the silane.

In order to further confirm the fact that tensile stress is lowered by depositing glass layers in a CVD reaction chamber wherein the water vapor content of the atmosphere therein is increased substantially above that normally present from the oxidation of the silane, glass layers are deposited upon a substrate containing a 1 micrometer-thick aluminum test pattern. An aluminum test pattern, which comprises a patterned aluminum layer disposed on a thermally oxidized silicon wafer, is used since oxide layers chemically vapor-deposited over aluminum are very susceptible to cracking.

EXAMPLE 5

The chemical vapor-deposition method of Example 1 is followed except that the silicon dioxide layer is deposited onto a 1 micrometer-thick aluminum test pattern disposed on a thermally oxidized silicon wafer.

In order to provide comparative data, the chemical vapor-deposition method of Example 5 is repeated except that no additional water vapor is added to the atmosphere.

EXAMPLE 6

The chemical vapor-deposition method of Example 2 is followed except that the silicon dioxide layer is deposited onto a 1 micrometer-thick layer of evaporated aluminum continuously disposed on a thermally oxidized silicon wafer.

EXAMPLE 7

The chemical vapor-deposition method of Example 5 is repeated except that a 1 micrometer-thick phosphosilicate glass layer is deposited onto the aluminum test pattern by substituting, for the 10 percent silane source, a gaseous mixture of 3 percent silicon tetrahydride (SiH$_4$) and 0.75 percent phosphine (PH$_3$) by volume in argon, the flow rate thereof being increased to 725 cubic centimeters per minute.

In order to provide comparative date, the chemical vapor-deposition method of Example 7 is repeated except that no additional water vapor is added to the atmosphere.

After chemically vapor-depositing the glass layers onto the aluminum substrate samples as outlined in Examples 5 through 7, the samples are etched in a hot (about 55° C.) aluminum etch for approximately ten minutes in order to reveal cracks in the deposited glass layers. The etching composition used in the present example consisted of 10 volumes of 85 percent concentrated H$_3$PO$_4$, 1 volume of concentrated 70 percent HNO$_3$, and 2.5 volumes of distilled water. Any cracks or pinholes in the overlying glass layers will allow the aluminum etch to penetrate to the aluminum and chemically remove it. A subsequent microscopic examination reveals where any cracks are located. The results of such visual examination of the aluminum samples are shown in Table II.

TABLE II

| | GLASS LAYERS ON ALUMINUM | | | |
|---|---|---|---|---|
| | Water Vapor Content (Factor Increase Over That Present From Chemical Reaction) | Deposition Rate (Å Per Minute) | Visual Examination | Visual Examination After Post-Deposition Heat Treatment |
| Silicon Dioxide Layer Deposited Upon a 1μm-Thick Aluminum Pattern at 450° C. | No Increase | 1000 | Some Cracks | Severely Cracked |
| | 9.2 Times | 1000 | No Cracks | A Few Cracks |
| | 14.5 Times | 350 | No Cracks | No Cracks |
| Phosphosilicate Glass Layer Deposited Upon a 1μm-Thick Aluminum Pattern at 450° C. | No Increase | 1000 | No Cracks | Some Cracks |
| | 9.2 Times | 1000 | No Cracks | No Cracks |

Microscopic examination showed that the silicon dioxide sample deposited without any increase in the water vapor content had some cracks, while the silicon dioxide samples deposited in atmospheres having the water vapor content increased by factors of 9.2 and 14.5 times, had no cracks. Both the phosphosilicate glass sample deposited without any increase in the water vapor content and the sample deposited in the presence of additional water vapor, had no cracks; this is attributed to the fact that phosphosilicate glass layers have lower intrinsic tensile stress as-deposited than silicon dioxide layers deposited under the same conditions.

All the samples which had glass layers deposited upon aluminum were then subjected to a post-deposition heat treatment, followed by reetching and reexamination under the microscope for cracks. These results are shown in Table II also. The silicon dioxide samples deposited at about 1000 Å per minute were reheated to 450° for 1.5 hours in nitrogen, cooled, and re-etched for an additional 10 minutes in the hot aluminum etch. Microscopic examination showed that the silicon dioxide sample deposited without any increase in the water vapor content was severely cracked, while the silicon dioxide sample deposited in an atmosphere having the water vapor content increased by a factor of about 9.2 times had just a few cracks. The silicon dioxide sample deposited at about 350 Å per minute in an atmosphere having the water vapor content increased by a factor of about 14.5 times was reheated to 450° C. for 0.5 hour in nitrogen, cooled, and re-etched; microscope examination of this sample showed no cracks. The phosphosilicate glass samples were reheated to 525° C. for 10 minutes, cooled, and re-etched. Some cracks did appear in the phosphosilicate glass layer deposited without any increase in the water vapor content, while no cracks were observed on the glass sample deposited in an atmosphere having the water vapor content increased by a factor of about 9.2 times.

The results shown in Tables I and II reveal that under the same deposition conditions, glass layers, including both silicon dioxide layers and doped silicate glass layers, which are chemically vapor-deposited by the oxidation of silane in a CVD reaction chamber wherein the water vapor content of the atmosphere therein is increased substantially above that normally present from the oxidation of the silane, have lower intrinsic tensile stress than glass layers deposited without any increase in the water vapor content. Such low-stress layers are much more resistant to cracking, thereby providing greater reliability for semiconductor devices manufactured in accordance with the present method. Infrared absorption spectroscopy of silicon dioxide and phosphosilicate glass layers chemically vapor-deposited in the presence of additional water vapor has shown no larger quantitites of included water in the deposited layer structure than is normally observed under the so-called "dry" (no additional water vapor present) conditions. Compositional analysis of the phosphosilicate glass layers has shown that the phosphorus content is not markedly affected under the "wet" deposition conditions.

A further advantage is obtained in the present invention from the step of adding water vapor to the atmosphere inside the CVD reaction chamber. In performing the preferred embodiment of the novel method, the nitrogen, or other carrier gas, which is saturated with water vapor is introduced into the CVD reaction chamber prior to starting the flow of silane (SiH4) into the chamber. By adding water vapor to the atmosphere prior to starting the flow of silane, the initial deposition of the glass layer occurs in an atmosphere containing approximately the steady-state level of water vapor rather than in an atmosphere containing a lesser degree of water vapor. By doing this, the deposition surface of the substrate is exposed to the water vapor prior to the start of the actual deposition process. As a result of such exposure to water vapor, the surface of the substrate, which may be silicon dioxide, becomes partially hydrated, by the conversion of oxygen bridges on the surface to silanol groups. Then, after the silane flow is started, the initially-deposited glass layer also contains more OH groups because of the higher moisture content in the ambient atmosphere. Consequently, the potential for molecular arrangements and for the formation of bridging oxygen bonds between the substrate oxide and the deposited glass layer is significantly enhanced, and the adhesion of the glass layer to the substrate is thereby improved.

The present invention provides a novel method of chemically vapor-depositing glass layers which, as-deposited, have relatively low intrinsic tensile stress. Such low-stress glass layers would be much less susceptible to the formation of cracks, and any further densification treatment would generally not be necessary. The use of such chemically vapor-deposited glass layers in the manufacture of semiconductor devices should result in higher yields and greater reliability, especially where the glass layers are used as an insulator or passivating glass, since glass cracking is a major cause of device degradation and failure.

What is claimed is:

1. In a method of chemically vapor-depositing a glass layer onto a substrate wherein said substrate is heated in an atmosphere comprising silane and oxygen to a temperature such that said silane is oxidized, the improvement in said method comprising the step of adding water vapor to said atmosphere to increase the water vapor content of said atmosphere substantially above that normally present therein from the oxidation of said silane, whereby the tensile stress of said deposited glass layer is reduced.

2. A method as recited in claim 1 wherein the water vapor content in mole percent of said atmosphere is at least two times that normally present from the oxidation of said silane.

3. A method as recited in claim 2 wherein the water vapor content in mole percent of said atmosphere is increased by a factor of about four times that normally present from the oxidation of said silane.

4. A method as recited in claim 3 wherein said deposition temperature is about 350° C. and said layer of glass is deposited at a rate of about 1750 Å per minute.

5. A method as recited in claim 2 wherein the water vapor content in mole percent of said atmosphere is increased by a factor of about seven times that normally present from the oxidation of said silane.

6. A method as recited in claim 5 wherein said deposition temperature is about 350° C. and said layer of glass is deposited at a rate of about 500 Å per minute.

7. A method as recited in claim 2 wherein the water vapor content in mole percent of said atmosphere is increased by a factor of about nine times that normally present from the oxidation of said silane.

8. A method as recited in claim 7 wherein said deposition temperature is about 450° C. and said layer of glass is deposited at a rate of about 1000 Å per minute.

9. A method as recited in claim 8 wherein said substrate is a silicon wafer and wherein said glass layer is silicon dioxide.

10. A method as recited in claim 8 wherein said substrate is a patterned aluminum layer disposed on a silicon wafer and wherein said glass layer is silicon dioxide.

11. A method as recited in claim 8 wherein said substrate is a patterned aluminum layer disposed on a silicon wafer and wherein said glass layer is phosphosilicate glass.

12. A method as recited in claim 2 wherein the water vapor content in mole percent of said atmosphere is increased by a factor of about fifteen times that normally present from the oxidation of said silane.

13. A method as recited in claim 12 wherein said deposition temperature is about 450° C. and said layer of glass is deposited at a rate of about 350 Å per minute.

14. A method as recited in claim 1 wherein the step of adding said water vapor to said atmosphere is performed prior to including said silane in said atmosphere.

15. A method of chemically vapor depositing a glass layer onto a surface of a substrate comprising heating said substrate while contacting said surface with a vaporous mixture comprising silane, oxygen, and water vapor, said water vapor being present in an amount substantially above that normally present therein from the oxidation of said silane, whereby the tensile stress of said deposited glass layer is reduced.

16. A method as recited in claim 15 wherein the water vapor content in mole percent of said vaporous mixture is at least two times that normally present from the oxidation of said silane.

* * * * *